United States Patent
Chen et al.

(10) Patent No.: US 12,453,219 B2
(45) Date of Patent: Oct. 21, 2025

(54) LIGHT EMITTING DIODE AND METHOD FOR MAKING THE SAME

(71) Applicant: XIAMEN SANAN OPTOELECTRONICS CO., LTD., Xiamen (CN)

(72) Inventors: Bo-Yu Chen, Xiamen (CN); Yu-Tsai Teng, Xiamen (CN); Chung-Ying Chang, Xiamen (CN)

(73) Assignee: XIAMEN SAN'AN OPTOELECTRONICS CO., LTD., Hongtang Town (CN)

( * ) Notice: Subject to any disclaimer, the term of this patent is extended or adjusted under 35 U.S.C. 154(b) by 596 days.

(21) Appl. No.: 17/662,983

(22) Filed: May 11, 2022

(65) Prior Publication Data
US 2022/0271205 A1    Aug. 25, 2022

Related U.S. Application Data

(63) Continuation-in-part of application No. PCT/CN2019/118965, filed on Nov. 15, 2019.

(51) Int. Cl.
| | |
|---|---|
| *H10H 20/853* | (2025.01) |
| *H10H 20/01* | (2025.01) |
| *H10H 20/841* | (2025.01) |
| *H10H 20/854* | (2025.01) |
| *H10H 20/857* | (2025.01) |

(52) U.S. Cl.
CPC ......... *H10H 20/853* (2025.01); *H10H 20/01* (2025.01); *H10H 20/841* (2025.01); *H10H 20/854* (2025.01); *H10H 20/857* (2025.01)

(58) Field of Classification Search
None
See application file for complete search history.

(56) References Cited

U.S. PATENT DOCUMENTS

| | | | |
|---|---|---|---|
| 6,177,166 B1 * | 1/2001 | Ohno | G11B 7/257 |
| 6,449,024 B1 * | 9/2002 | Hirakata | G02F 1/134363 |
| | | | 349/86 |
| 9,209,354 B2 * | 12/2015 | Hussell | H01L 25/0753 |

(Continued)

FOREIGN PATENT DOCUMENTS

TW    201824583 A    7/2018

OTHER PUBLICATIONS

Search Report issued to PCT application No. PCT/CN2019/118965 on Aug. 19, 2020.

*Primary Examiner* — Dale E Page
*Assistant Examiner* — Patrick Cullen
(74) *Attorney, Agent, or Firm* — MUNCY, GEISSLER, OLDS & LOWE, P.C.

(57) ABSTRACT

A light-emitting diode includes an epitaxial unit, a first electrode, and a second electrode. One of the first electrode and the second electrode includes a first reflective layer, a wire-bonding electrode layer, a second reflective layer wrapping a portion of the wire-bonding electrode layer, and a stress adjustment layer which wraps around the first reflective layer. The first reflective layer includes platinum, and the second reflective layer includes a material which has a Mohs hardness of not less than 6. The stress adjustment layer has a Mohs hardness of not less than 6, and the stress adjustment layer has a thickness that is 65% to 75% of a thickness of the first reflective layer.

17 Claims, 7 Drawing Sheets

(56) References Cited

U.S. PATENT DOCUMENTS

| | | | | |
|---|---|---|---|---|
| 2006/0077153 A1* | 4/2006 | Cummings | .......... | G02B 26/001 |
| | | | | 345/85 |
| 2008/0055901 A1* | 3/2008 | Sanpei | .................... | F21V 31/04 |
| | | | | 257/E33.072 |
| 2008/0237620 A1* | 10/2008 | Shiue | .................. | H10H 20/835 |
| | | | | 257/E33.001 |
| 2013/0240923 A1* | 9/2013 | Hsu | ..................... | H10H 20/835 |
| | | | | 438/34 |
| 2014/0020936 A1* | 1/2014 | Kim | ........................ | H05K 3/10 |
| | | | | 174/255 |
| 2014/0231849 A1 | 8/2014 | Song et al. | | |
| 2015/0034472 A1* | 2/2015 | Li | ........................ | G06F 3/0443 |
| | | | | 200/5 R |
| 2018/0159005 A1 | 6/2018 | Pokhriyal et al. | | |
| 2018/0356701 A1* | 12/2018 | Hyodo | ............... | G02F 1/136286 |
| 2020/0020869 A1* | 1/2020 | Kang | .................... | H10K 71/00 |

\* cited by examiner

LIGHT EMITTING DIODE AND METHOD FOR MAKING THE SAME

CROSS-REFERENCE TO RELATED APPLICATION

This application is a bypass continuation-in-part application of PCT International Application No. PCT/CN2019/118965 filed on Nov. 15, 2019. The entire content of each of the International and the Chinese patent application is incorporated herein by reference.

FIELD

The disclosure relates to a light-emitting diode, and more particularly to a light-emitting diode and a method for making the same.

BACKGROUND

Figure 1:
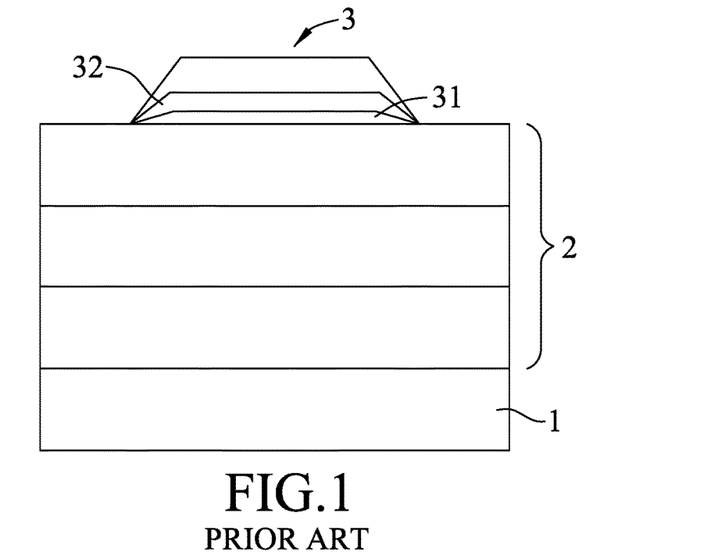
FIG. 1 is a schematic view illustrating a conventional light-emitting diode.

As shown in FIG. 1, a conventional light-emitting diode (LED) includes a substrate 1, an epitaxial unit 2, and an electrode structure 3. The design of the electrode structure 3 takes into account the light extraction efficiency and incorporates a high reflectivity material as a reflective layer 31 to improve the light efficiency of the LED. However, most high reflectivity materials such as silver, or copper etc., are easily affected by environmental factors such as temperature, humidity, acidity and alkalinity, etc., which may reduce the stability of the LED chip. Therefore, in order to alleviate the drawbacks of incorporating the highly reflective material, the electrode structure of the LED chip is protected by a metallic protective layer 32 with low metal mobility.

However, this design can only delay the time until the reflective layer reacts with environmental factors, and cannot completely avoid the migration or precipitation of the metal material or prevent the electrode structure 3 from detaching from an underlying layer of the LED, which may lead to failure of the LED. The conventional LED using the aforesaid electrode structure 3 will have limited spheres of application, and will not be suitable for application under high current, high driving voltage, or extreme environments.

SUMMARY

Therefore, an object of the disclosure is to provide a light-emitting diode and a method for making a light-emitting diode.

According to one aspect of the disclosure, the light-emitting diode includes an epitaxial unit, a first electrode, and a second electrode. The epitaxial unit includes a first semiconductor layer, a second semiconductor layer, and an active layer disposed between the first semiconductor layer and the second semiconductor layer in a laminating direction. The first electrode is electrically connected to the first semiconductor layer, and the second electrode is electrically connected to the second semiconductor layer. At least one of the first electrode and the second electrode includes a first reflective layer, a wire-bonding electrode layer disposed on the first reflective layer, a second reflective layer wrapping at least a portion of the wire-bonding electrode layer, and a stress adjustment layer which wraps around the first reflective layer. At least one of the first reflective layer and the second reflective layer includes a material which has a Young's modulus of not less than 150 GPa and a bulk modulus of not less than 200 GPa. The first reflective layer includes platinum, and the second reflective layer includes a material which has a Mohs hardness of not less than 6. A stress direction generated from layer formation of the stress adjustment layer is opposite to a stress direction generated from layer formation of the first reflective layer. The stress adjustment layer has a Mohs hardness of not less than 6, and the stress adjustment layer has a thickness that is 65% to 75% of a thickness of the first reflective layer.

According to another aspect of the disclosure a method for making a light-emitting diode includes: providing a substrate; forming an epitaxial unit on the substrate in a laminating direction; forming a photoresist layer on the epitaxial unit, the photoresist layer having a recess which exposes the epitaxial unit; and forming at least one of a first electrode and a second electrode in the recess of the photoresist layer. The at least one of the first electrode and the second electrode includes a first reflective layer, a wire-bonding electrode layer, and a second reflective layer formed sequentially on the photoresist layer and on the epitaxial unit exposed from the recess of the photoresist layer. At least one of the first reflective layer and the second reflective layer is made of a material which has a Young's modulus of not less than 150 GPa and a bulk modulus of not less than 200 GPa, and at least one of the first reflective layer and the second reflective layer on the photoresist layer expands an opening of the recess by growth stress.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
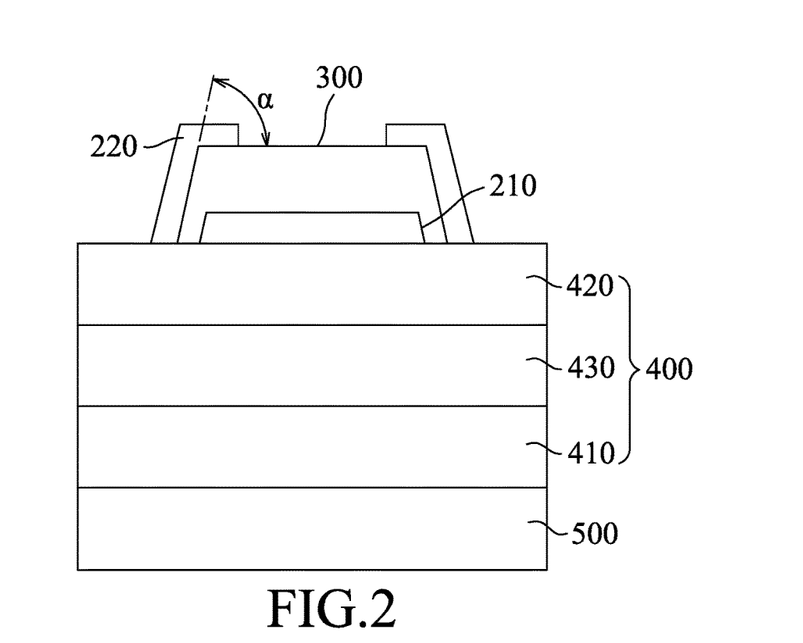
FIG. 2 is a schematic view illustrating a first embodiment of a light-emitting diode according to the present disclosure.
Figure 8:
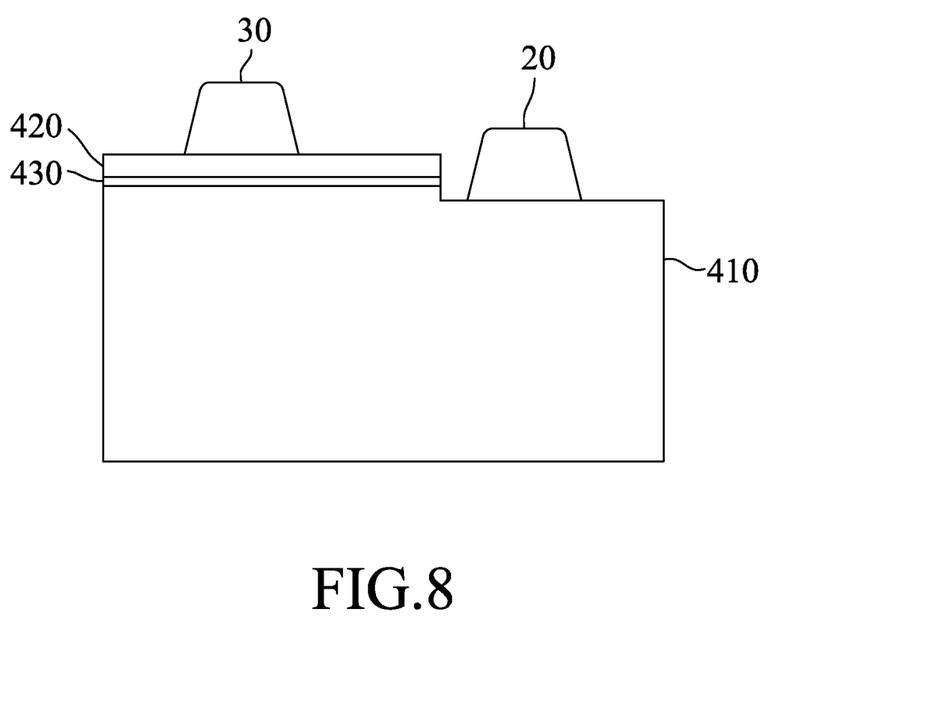
FIG. 8 is a schematic view illustrating an embodiment of the light-emitting diode according to the present disclosure.

Referring to FIG. 2, a first embodiment of a light-emitting diode according to the present disclosure is provided. The light-emitting diode may be one of a wire-bonded light-emitting diode, a flip-chip light-emitting diode, and a vertical light-emitting diode, and is exemplified as the wire-bonded light-emitting diode in FIG. 2. The light-emitting diode includes a substrate 500, an epitaxial unit 400, a first electrode 20, and a second electrode 30. It should be noted that FIG. 2 only shows the second electrode 30. The first electrode 20 may be referred to the embodiment shown in FIG. 8.

The substrate 500 is used for supporting the epitaxial unit 400. The substrate 500 may be made of a material that includes, but is not limited to, sapphire, silicon, silicon nitride, glass, gallium nitride (GaN), gallium arsenide (GaAs), and other suitable material. In certain embodiments, the substrate 500 is a sapphire substrate that is formed with a plurality protrusions on its surface. The protrusions may be formed via dry etching and have different slopes. Alternatively, the protrusions may be formed via wet etching and have the same slope. The epitaxial unit 400 may be made of, e.g., a gallium nitride (GaN) based material, and is formed via chemical vapor deposition (CVD). The epitaxial unit 400 includes a first semiconductor layer 410, a second semiconductor layer 420, and an active layer 430 disposed between the first semiconductor layer 410 and the second semiconductor layer 420 in a laminating direction. The first electrode 20 is electrically connected to the first semiconductor layer 410, and the second electrode 30 is electrically connected to the second semiconductor layer 420. In certain embodiments, the first semiconductor layer 410 has N-type polarity, and the second semiconductor layer 420 has P-type polarity. The first or second semiconductor layers 410, 420 may be doped with different dopants to achieve a specific polarity. Light from the active layer is mainly emitted outwardly through the second semiconductor layer 420.

At least one of the first electrode 20 and the second electrode 30 includes a first reflective layer 210 that may be in direct contact with the epitaxial unit 400, a wire-bonding electrode layer 300 for wire bonding to an external power source, and a second reflective layer 220. The wire-bonding electrode layer 300 is disposed on the first reflective layer 210 and may be in direct contact with the first reflective layer 210. The second reflective layer 220 wraps at least a portion of the wire-bonding electrode layer 300. The second reflective layer 220 may be coated with an insulating layer such as silica ($SiO_2$) or alumina ($Al_2O_3$), and the electrode layer 300 is made of gold. The first reflective layer 210 and the second reflective layer 220 improves the light extraction efficiency of the LED.

In certain embodiments, at least one of the first reflective layer 210 and the second reflective layer 220 includes a material of one of platinum (Pt), rhodium (Rh), ruthenium (Ru) and combinations thereof. Such materials for the at least one of the first reflective layer 210 and the second reflective layer 220 has high mechanical strength, high stability, and low resistivity, which increases resistance to scratch and damage of the electrode (s) and decreases the chance of the electrode (s) from detaching from the epitaxial unit 400. Additionally, the material of one of platinum (Pt), rhodium (Rh), ruthenium (Ru) and combinations thereof presented in the at least one of the first reflective layer 210 and the second reflective layer 220 is not less than 50 at %. In certain embodiments, at least one of the first reflective layer 210 and the second reflective layer 220 includes a material which has a Young's modulus of not less than 150 Gpa and a bulk modulus of not less than 200 Gpa. The bulk modulus, shear modulus and Young's modulus can be converted using the Poisson ratio. The wire-bonding electrode layer 300 is disposed on top of the first reflective layer 210, and the second reflective layer 220 wraps around the wire-bonding electrode layer 300. The first and second reflective layers 210, 220 sandwiching the wire-bonding electrode layer 300 provides the electrode(s) with improved stress characteristics, so that the electrode(s) may have a stronger structure, thereby allowing the electrode layer 300 to be formed with a steeper sloped side wall. The abovementioned materials included in the first and second reflective layers 210, 220 (i.e., platinum (Pt), rhodium (Rh), ruthenium (Ru)) each offer different advantages. Platinum (Pt) may allow the electrode(s) to be formed with the steeper sloped side walls. However, rhodium (Rh) with a Mohs hardness of 6 or ruthenium (Ru) with a Mohs hardness of 6.5 may be chosen to prevent compression damage on the electrode(s). In some embodiments, the first reflective layer 210 includes a material with a Mohs hardness of not less than 6.5, and the material is also preferably a metal with low metal migration and a resistance of less than 100nΩ m.

When manufacturing the light-emitting diode, the electrode(s) is usually formed via photolithography techniques. The present disclosure employs the material's inherent stress characteristics to increase coating angle and wrapping width. The at least one of the first electrode 20 and the second electrode 30 has a trapezoidal cross-section in the laminating direction, and has an included angle ($\alpha$) between a base of the trapezoidal cross-section and a lateral side of the trapezoidal cross-section that is not less than 60 degrees. In other embodiments of the present disclosure, the included angle ($\alpha$) may range from 60° to 75°, or 75° to 80°, or more than 80°. According to contemporary LED design principles, the included angle of an electrode in a conventional LED are usually made lower (between 45 and 60 degrees) so that the electrodes are more fully encased by the reflective layer to prevent metal migration. However, the light-emitting diode 10 of this disclosure circumvents this limitation by using a larger included angle to provide a more even contact surface, a larger contact surface area so as to reduce current density, metal migration and drive voltage, and to increase heat dissipation (i.e., reduce thermal effects), thus improving the end product characteristics and increasing its service life. The thickness of the electrode may also be adjusted to save costs while claiming the above mentioned beneficial characteristics. More specifically, the thickness of the wire-bonding electrode layer 300 may be adjusted to achieve the aforesaid advantages. If the wire-bonding electrode layer 300 is made of gold, according to voltage requirements, the thickness of the wire-bonding electrode layer 300 may be reduced from 2.7 µm to 2.0 µm, or from 1.5 µm to 1.2 µm for smaller a LED device. With the large included angle, the light-emitting diode may have good electrical characteristics.

At least one of the first reflective layer 210 and the second reflective layer 220 has a reflectance of not less than 20% at a wavelength that ranges from 250 nm to 800 nm, and preferably a reflectance of not less than 45% at a wavelength that ranges from 400 nm to 700 nm. In the second embodiment of the light emitting diode according to the present disclosure which emits light with a wavelength of less than 350 nm (in the ultraviolet region of the electromagnetic spectrum, especially in the deep ultraviolet region), platinum (Pt) or rhodium (Rh) is preferably used as the material for the second reflective layer 220. UV light, especially deep UV light, has an oxidation-promoting effect on aluminum (Al) or silver (Ag) used in conventional electrodes. An indium tin oxide (ITO) layer used in the conventional LED and contacting an electrode would absorb light. Additionally, the adhesion between aluminum and ITO layer is weak, and the conventional LED has a lower work function under large current, and luminous efficacy of the LED is reduced. In some embodiments, the light-emitting diode emits light with a wavelength of 350 nm to 400 nm. In other embodiments, the light-emitting diode emits light with a wavelength of 400 nm to 500 nm, and in still other embodiments, light with a wavelength of over 500 nm is emitted by the light-emitting diode.

In the third embodiment of the invention, the light-emitting diode has a size of not greater than 250 μm×250 μm. In other embodiments, the light-emitting diode 10 may have a length that ranges from 2 μm to 250 μm (e.g., 2 μm to 100 μm or 100 μm to 250 μm), or a width that ranges from 2 μm to 250 μm (e.g., 2 μm to 100 μm or 100 μm to 250 μm). The first and second reflective layers 210, 220 in this disclosure are designed to be appropriate for use in mini-LEDs or micro-LEDs where the electrode size is small, and the reflective loss due to the electrode may be negligible.

Figure 3:
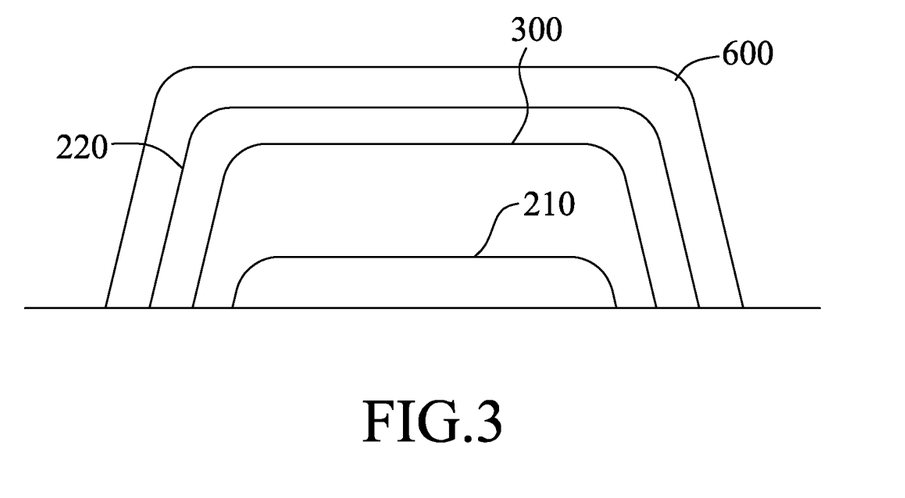
FIG. 3 is a schematic view illustrating an electrode included in an embodiment of the light-emitting diode according to the present disclosure.

FIG. 3 shows a variation of an electrode structure included in a fourth embodiment of the present invention. In this embodiment, the at least one first electrode 20 and second electrode 30 further includes an insulating protection layer 600 which is disposed on the second reflective layer 220 opposite to the wire-bonding electrode layer 300. The insulating protection layer 600 includes a material of one of silicon oxide, silicon nitride, aluminum oxide, aluminum nitride, titanium oxide, niobium oxide), titanium nitride, and combinations thereof. Adhesion between the second reflective layer 220 and the insulating protection layer 600 is stronger than that between the wire-bonding electrode layer 300 and insulating protection layer 600.

Figure 4:
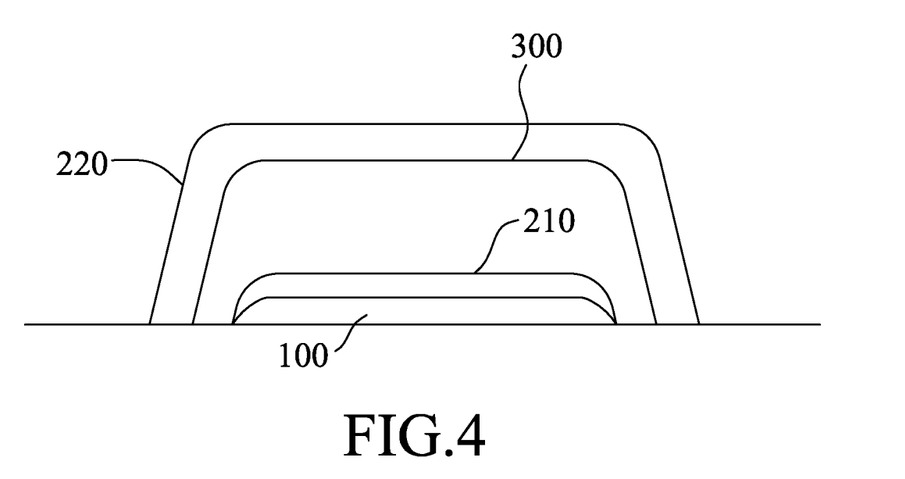
FIG. 4 is a schematic view illustrating a variation of the electrode included in an embodiment of the light-emitting diode according to the present disclosure.

FIG. 4 shows a variation of the electrode structure included in the fifth embodiment of the present disclosure. The at least one of the first electrode 20 and second electrode 30 further includes a contact layer 100 disposed between the epitaxial unit 400 (as shown in FIG. 1) and the first reflective layer 210, and the first reflective layer 210 is wrapping at least a portion of the contact layer 100. The contact layer 100 is made of chromium (Cr) or an alloy containing transition metal (s) and chromium (Cr). For example, the alloy may be a Cr/Pt alloy, which may be made by co-plating or annealing.

The present invention also provides an embodiment of a method for manufacturing the aforesaid light-emitting diode. The method includes steps 101 to 104. In step 101 of the method, the substrate 500 is provided. Then, in step 102, the epitaxial unit 400 is formed on the substrate 500 in the laminating direction. The method then proceeds to step 103 where a photoresist layer 700 is formed on the epitaxial unit 400. The photoresist layer 700 has an recess which exposes the epitaxial unit 400. Then, in step 104, at least one of a first electrode 20 and a second electrode 30 is formed in the recess of the photoresist layer 700. The at least one of the first electrode 20 and the second electrode 30 in step 104 includes the first reflective layer 210, the wire-bonding electrode layer 300, and the second reflective layer 220 formed sequentially on the photoresist layer 700 and on the epitaxial unit 400 exposed from the recess of the photoresist layer 700. The at least one of the first reflective layer 210 and second reflective layer 220 in step 104 is made of a material which has a Young's modulus of not less than 150 GPa and a bulk modulus of not less than 200 GPa. The at least one of the first reflective layer 210 and the second reflective layer 220 on the photoresist layer 700 expands an opening of the recess of the photoresist layer 700 by growth stress.

As mentioned above, the at least one of the first electrode 20 and the second electrode 30 has the trapezoidal cross-section in the laminating direction, and the included angle between the base of the trapezoidal cross-section and the lateral side of the trapezoidal cross-section is not less than 60°.

Figure 5A:
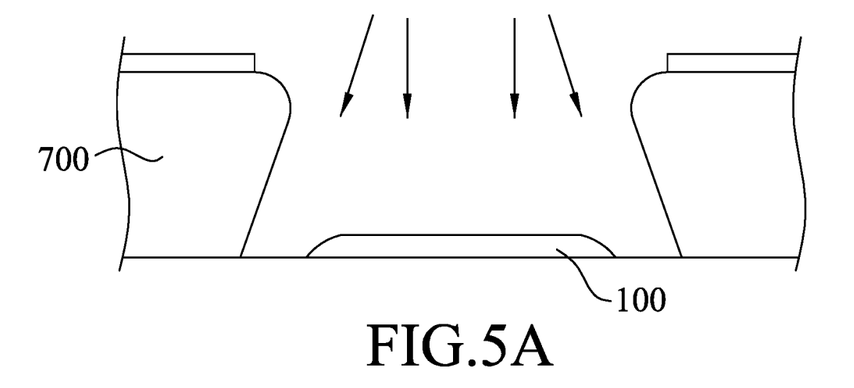
FIGS. 5A and 5B are schematic views illustrating a conventional step of forming an electrode of a conventional light-emitting diode.
Figure 5B:
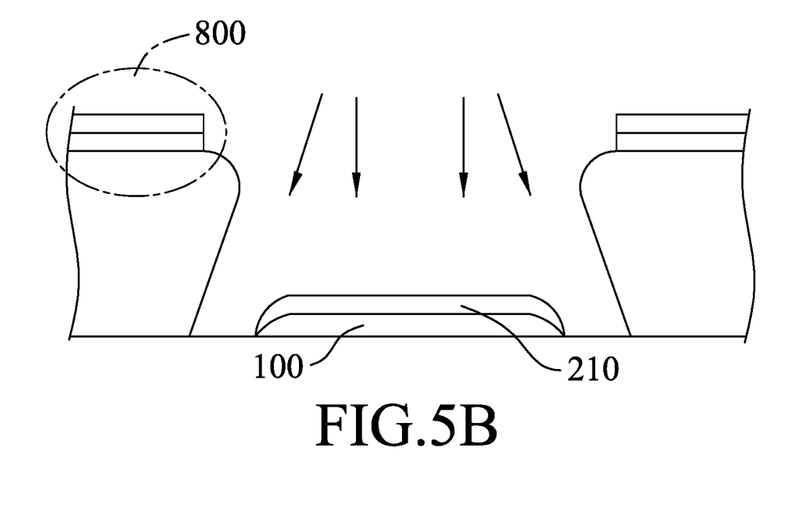
Figure 6A:
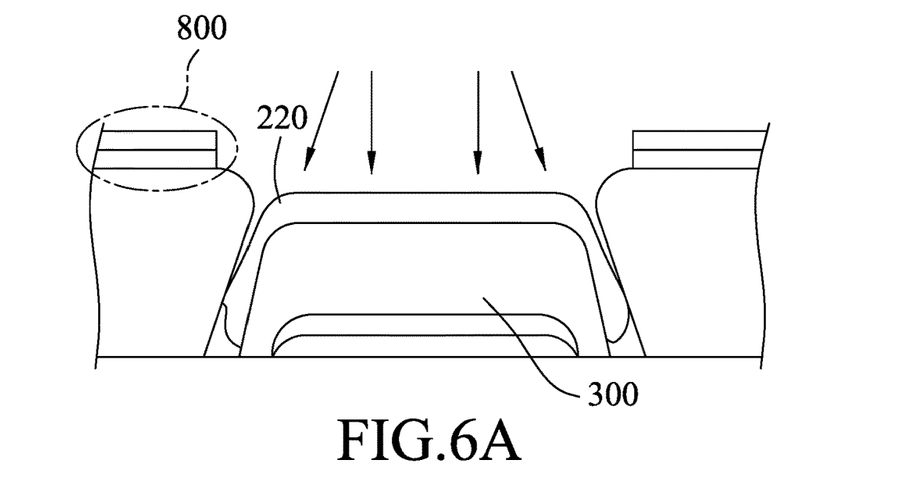
FIGS. 6A and 6B are schematic views illustrating the electrodes formed by the conventional step shown in FIGS. 5A and 5B and the step of the present disclosure shown in FIGS. 5C and 5D, respectively.

FIG. 5A and FIG. 5B show a conventional method of manufacturing an LED electrode. It is worth noting that the conventional LED electrode is usually made using a photolithographic process. In the photolithographic process, it is undesirable to have a large recess in a photoresist layer (corresponding to the aforesaid photoresist layer 700) which may unnecessarily increase the size of the electrode and thus increase light absorption by the enlarged electrode, thereby losing brightness. FIGS. 5A and 5B show a depositing process, and the arrows in the figures show the deposition direction. If the recess of the photoresist layer 700 is too small, there will not be enough space for the second reflective layer 220 to fully wrap around the wire-bonding electrode layer 300 (as shown in FIG. 6A). Additionally, as shown in FIGS. 5A and 5B, during deposition, a metal film 800 is formed evenly on the photoresist layer 700. The metal film 800 is composed of the material of the contact layer and the material of the first reflective layer.

Figure 5C:
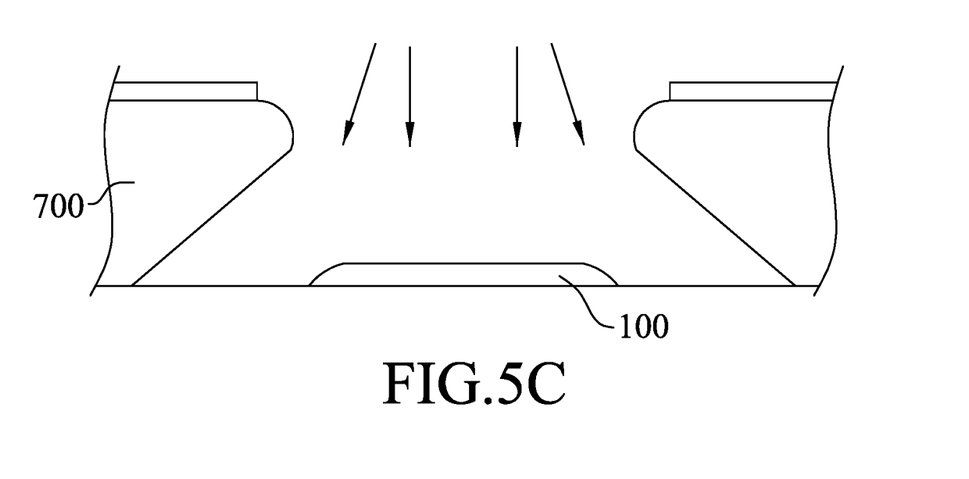
FIGS. 5C and 5D are schematic views illustrating a step of a method for forming an embodiment of a light-emitting diode according to the present disclosure.
Figure 5D:
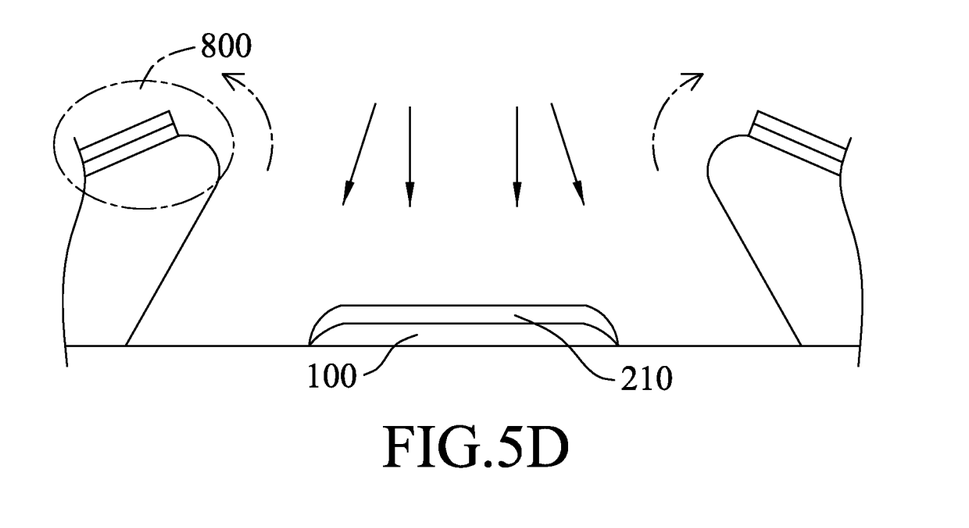
Figure 6B:
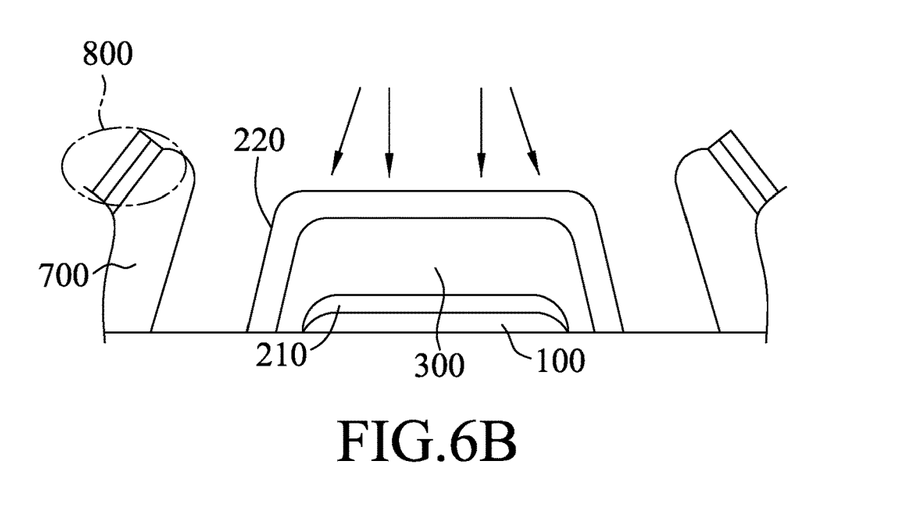

Referring to FIGS. 5C, 5D and 6B, the at least one of the first reflective layer 210 and the second reflective layer 220 is made of a material including rhodium (Rh), platinum (Pt) or ruthenium (Ru) or it may include a materials with a Young's modulus and bulk modulus close to or higher than ruthenium (Ru), such as materials with a Young's modulus of more than 150 GPa (e.g., the Young's modulus of more than 300 GPa) and a bulk modulus of more than 200 GPa. In certain embodiments, the at least one of the first reflective layer 210 and the second reflective layer 220 is made of ruthenium (Ru). During the deposition procedure, a metal film 800 composed of the materials of the contact layer 100 and the material of the first reflective layer 210 or the second reflective layer 220 is deposited on a surface of the photoresist layer 700. Due to the material of the first and second reflective layers 210, 220 in the metal film 800, the metal film 800 creates relatively large stress on the photoresist layer 700 that expands an opening of the recess of the photoresist layer 700 so as to create more space for the second reflective layer 220 to be deposited and to wrap on the wire-bonding electrode layer 300, which increases resistance against metal migration. Therefore, in the method according to the present disclosure, the recess of the photoresist layer 700 is maintained in a relatively small size so that the size of the at least one of the first and second electrode 30s may be controlled. Then, the metal film 800 deposited on the photoresist layer 700 enlarges the opening of the recess of the photoresist layer 700 so as to provide more space for the second reflective layer 220 to be formed on the wire-bonding electrode layer 300. The manufacturing process of this disclosure is particularly suitable for use in manufacturing mini-LEDs or micro-LEDs in addition to conventional light-emitting diodes. Preferably, the thickness of the second reflective layer 220 is not less than 200 A. With at least a certain thickness, the stress characteristics may be improved. Similarly, the first reflective layer 210 may be made of a material with high stress characteristics as described above which is advantageous for forming the electrode with the large included angle (α).

Comparing FIG. 6A and FIG. 6B, a clear difference is observable between the conventional electrode manufacturing process and the electrode manufacturing process according to the present disclosure. The electrode made by the conventional manufacturing process usually has a smaller included (e.g., 45° to 60°). Due to the small included angle, the side walls of the electrode are less sloped, and the second reflective layer 220 would not be evenly and fully cover the wire-bonding electrode layer 300. In this embodiment, with the metal film 800 having a high stress, the opening of the recess of the photoresist layer 700 is enlarged, and the electrodes of this disclosure may have the large included angle, so that the electrode has a relatively large top surface. With the large included angle, the operating voltage may be reduced the heat dissipation capacity of the LED may be increased.

Referring to FIG. 6B, the first reflective layer 210 and the second reflective layer 220 are in direct contact with the epitaxial unit 400 (see FIG. 2), and a minimum distance between the first reflective layer 210 and the second reflective layer 220 is not less than 200 Å. In the sixth embodiment according to the present disclosure, the distance is set from 200 Å to 250 Å, or more than 250 Å. The minimum distance here refers to a distance in the laminating direction. The first reflective layer 210 has better anti metal migration properties that prevent metal migration of the contact layer 100. The first reflective layer 210 has a thickness not less than 500 Å, and the second reflective layer 220 has a thickness not less than 200 Å. The thicknesses of the first reflective layer 210 and the second reflective layer 220 ensure sufficient structural strength and prevent compression damage to the electrode. According to an experimental test, the light-emitting diode according to the present disclosure had no obvious metal migration after heating to 480° C. for 1 hour. In a brine test, the light-emitting diode was submerged in brine water for 240 hours and no abnormality was found.

Figure 7:
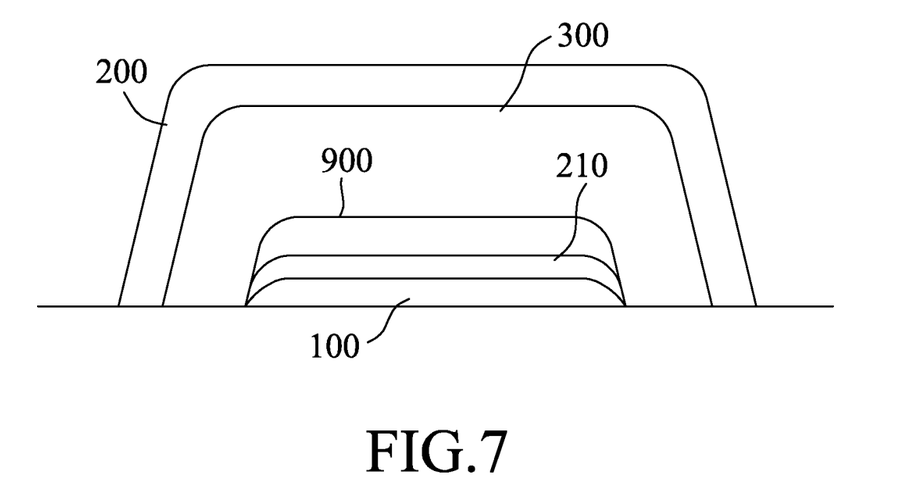
FIG. 7 is a schematic view illustrating another variation of the electrode included in an embodiment of the light-emitting diode according to the present disclosure.

Referring to FIG. 7, in the seventh embodiment according to the present disclosure, the contact layer 100 includes a layer of chromium (Cr) with a thickness in a range from 25 to 50 Å, and the first reflective layer 210 of the platinum (Pt) layer coated on top of the chromium (Cr). The platinum layer may have a thickness of 800 Å or more. An alloy of platinum (Pt) and chromium (Cr) may be used as a material for the contact layer 100 and the first reflective layer 210. When the first reflective layer 210 includes platinum (Pt), growth stress may be relatively high which may cause detachment of the electrode. Therefore, the at least one of the first electrode 20 and the second electrode 30 may further include a stress adjustment layer 900 which wraps around the first reflective layer 210. A stress direction generated from layer formation of the stress adjustment layer 900 is opposite to a stress direction generated from layer formation of the first reflective layer 210. In certain embodiments, the stress adjustment layer 900 has a Mohs hardness of not less than 6. In certain embodiments, the stress adjustment layer 900 has a Young's modulus of not less than 150 GPa and a bulk modulus of not less than 200 GPa. In certain embodiments, the stress adjustment layer 900 includes a material of any one of ruthenium (Ru) and rhodium (Rh). In one embodiment where the material of the stress adjustment layer 900 is ruthenium (Ru), in order to equalize the growth stress, the thickness of the stress adjustment layer 900 is 65% to 75% of the thickness of the first reflective layer 210. The stress of the first reflective layer pulling downward is balanced by the stress of the stress adjustment layer 900 pulling upward. In addition to balancing the stress, the stress adjustment layer 900 may also enhance light output and has a reflectance of more than 45% at a wavelength that ranges from 250 nm to 850 nm, which enhances the design of the product and reduces the risk of the electrodes detaching from the light-emitting diode. The stress adjustment layer 900 is also conducive for enhancing current flow, and the at least one of the first reflective layer 210 and the stress adjustment layer 900 has an electrical resistivity of less than 130 n$\Omega$·m.

In some implementations of the embodiments, the first reflective layer 210 may include a plurality of reflective films and a plurality of stress adjustment material films that are alternately disposed on one another. A stress direction generated from layer formation of the reflective film is opposite to a stress direction generated from layer formation of the stress adjustment material films. For example, the first reflective layer 210 includes a plurality of Pt layers (as reflective films) and a plurality of Ti layers (as the stress adjustment material films).

In the eighth embodiment of the light-emitting diode which is similar to the seventh embodiment, the second reflective layer 220 includes a material with a Mohs hardness of not less than 6 (e.g., ruthenium (Ru) or rhodium (Rh)), and the stress adjustment layer 900 has a Mohs hardness of not less than 6. At the same time, the stress adjustment layer 900 has a thickness not less than 500 Å, and the second reflective layer 220 has a thickness not less than 200 Å, thereby stabilizing the structure of the wire-bonding electrode layer 300 from two sides and providing resistance against compression.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A light-emitting diode, comprising:
    an epitaxial unit which includes a first semiconductor layer, a second semiconductor layer, and an active layer disposed between said first semiconductor layer and said second semiconductor layer in a laminating direction;
    a first electrode electrically connected to said first semiconductor layer; and
    a second electrode electrically connected to said second semiconductor layer;
    wherein
    at least one of said first electrode and said second electrode includes a first reflective layer, a wire-bonding electrode layer disposed on said first reflective layer, a second reflective layer wrapping at least a portion of said wire-bonding electrode layer, and a stress adjustment layer which wraps said first reflective layer, at least one of said first reflective layer and said second reflective layer includes a material which has a Young's modulus of not less than 150 GPa and a bulk modulus of not less than 200 GPa, said first reflective layer includes platinum, and said second reflective layer includes a material which has a Mohs hardness of not less than 6, a stress direction generated from layer formation of said stress adjustment layer is opposite to a stress direction generated from layer formation of said first reflective layer, said stress adjustment layer has a Mohs hardness of not less than 6, said stress adjustment layer has a thickness that is 65% to 75% of a thickness of said first reflective layer; and wherein said wire-bonding electrode layer is gold and is sandwiched between said second reflective layer and said stress adjustment layer.

2. The light-emitting diode of claim 1, wherein:

at least one of said first electrode and second electrode has a trapezoidal cross-section in the laminating direction; and an included angle between a base of said trapezoidal cross-section and a lateral side of said trapezoidal cross-section is not less than 60°.

3. The light-emitting diode of claim 1, wherein:

said light-emitting diode has a size of not greater than 250 μm×250 μm;

said light-emitting diode has a length that ranges from 2 μm to 250 μm; and said light-emitting diode has a width that ranges from 2 μm to 250 μm.

4. The light-emitting diode of claim 1, wherein said at least one of said first electrode and second electrode further includes an insulating protection layer which is disposed on said second reflective layer opposite to said wire-bonding electrode layer.

5. The light-emitting diode of claim 4, wherein said insulating protection layer includes a material of one of silicon oxide, silicon nitride, aluminum oxide, aluminum nitride, titanium oxide, niobium oxide, titanium nitride, and combinations thereof.

6. The light-emitting diode of claim 1, wherein said at least one of said first electrode and said second electrode further includes a contact layer disposed between said epitaxial unit and said first reflective layer, said first reflective layer wrapping at least a portion of said contact layer.

7. The light-emitting diode of claim 6, wherein said contact layer is made of chromium or an alloy containing transition metal and chromium, and said stress adjustment layer includes a material of any one of ruthenium and rhodium.

8. The light-emitting diode of claim 1, wherein said stress adjustment layer has a Young's modulus of not less than 150 GPa and a bulk modulus of not less than 200 GPa.

9. The light-emitting diode of claim 1, wherein at least one of said first reflective layer and said stress adjustment layer has an electrical resistivity of less than 130 nΩ·m.

10. The light-emitting diode of claim 1, wherein a minimal distance between said first reflective layer and said second reflective layer is not less than 200 Å.

11. The light-emitting diode of claim 1, wherein:

said first reflective layer and said second reflective layer are in direct contact with said epitaxial unit; and a minimal distance between said first reflective layer and said second reflective layer is not less than 200 Å.

12. The light-emitting diode of claim 1, wherein said first reflective layer has a thickness not less than 500 Å, and said second reflective layer has a thickness not less than 200 Å.

13. The light-emitting diode of claim 1, wherein at least one of said first reflective layer and said second reflective layer has a reflectance of not less than 45% at a wavelength that ranges from 400 nm to 700 nm.

14. The light-emitting diode of claim 1, wherein said light-emitting diode is one of a wire-bonded light-emitting diode, a flip-chip light-emitting diode, and a vertical light-emitting diode.

15. The light-emitting diode of claim 1, wherein said second reflective layer includes a material of one of platinum, ruthenium, rhodium, and combinations thereof.

16. A method for making a light-emitting diode, comprising:

providing a substrate;

forming an epitaxial unit on the substrate in a laminating direction;

forming a photoresist layer on the epitaxial unit, the photoresist layer having an opening which exposes the epitaxial unit; and forming at least one of a first electrode and a second electrode in the opening of the photoresist layer, wherein the at least one of the first electrode and the second electrode includes a first reflective layer formed on the photoresist layer and on the epitaxial unit exposed from the opening of the photoresist layer, a wire-bonding electrode layer formed on top of said first reflective layer through the opening, and a second reflective layer formed on top of and wrapping said wire-bonding electrode layer, the first reflective layer is made of a material which has a Young's modulus of not less than 150 GPa and a bulk modulus of not less than 200 GPa, the wire-bonding electrode layer is sandwiched between the first reflective layer and the second reflective layer, and when the first reflective layer is deposited on the photoresist layer the opening of the photoresist layer expands by growth stress of the material of the first reflective layer.

17. The method of claim 16, wherein:

at least one of the first electrode and the second electrode has a trapezoidal cross-section in the laminating direction; and an included angle between a base of the trapezoidal cross-section and a lateral side of the trapezoidal cross-section is not less than 60°.

\* \* \* \* \*